(12) United States Patent
Hirata et al.

(10) Patent No.: US 10,541,664 B2
(45) Date of Patent: Jan. 21, 2020

(54) CONDUCTIVE PATH WITH NOISE FILTER

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Keiji Hirata, Mie (JP); Akihiro Hayashi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 51 days.

(21) Appl. No.: 15/742,562

(22) PCT Filed: Aug. 27, 2015

(86) PCT No.: PCT/JP2015/074238
§ 371 (c)(1),
(2) Date: Jan. 8, 2018

(87) PCT Pub. No.: WO2017/006496
PCT Pub. Date: Jan. 12, 2017

(65) Prior Publication Data
US 2018/0205356 A1 Jul. 19, 2018

(30) Foreign Application Priority Data
Jul. 9, 2015 (JP) .................... 2015-137733

(51) Int. Cl.
*H03H 7/01* (2006.01)
*H03H 7/09* (2006.01)
(Continued)

(52) U.S. Cl.
CPC ............ *H03H 7/0115* (2013.01); *H03H 7/09* (2013.01); *H03H 7/427* (2013.01); *H03H 1/0007* (2013.01); *H03H 2001/0092* (2013.01)

(58) Field of Classification Search
CPC ....... H03H 7/0115; H03H 1/0007; H03H 7/09
(Continued)

(56) References Cited

U.S. PATENT DOCUMENTS

2006/0087823 A1   4/2006   Park
2013/0154766 A1*  6/2013   Beck .................. H03H 1/0007
                                                           333/182

FOREIGN PATENT DOCUMENTS

JP   H10135681 A     5/1998
JP   2001-286152 A  10/2001
(Continued)

OTHER PUBLICATIONS

JP2006080215, English Translation (Year: 2006).*
(Continued)

*Primary Examiner* — Rakesh B Patel
(74) *Attorney, Agent, or Firm* — Honigman LLP (57) ABSTRACT

A conductive path with noise filter that enables an effective reduction in a surge noise in a specific frequency band is provided. A conductive path with noise filter includes conductive path main bodies, insulating layers that respectively surround the conductive path main bodies, conductive layers that are respectively provided to correspond to the conductive path main bodies with the insulating layers being sandwiched between the conductive layers and the conductive path main bodies and that respectively form capacitors in combination with the conductive path main bodies, and inductors connected to the conductive layers.

4 Claims, 5 Drawing Sheets

(51) Int. Cl.
*H03H 7/42* (2006.01)
*H03H 1/00* (2006.01)

(58) Field of Classification Search
USPC .................................. 333/181, 185; 336/170
See application file for complete search history.

(56) References Cited

FOREIGN PATENT DOCUMENTS

| JP | 2006-080215 A | 3/2006 |
|---|---|---|
| JP | 2013-110580 A | 6/2013 |
| JP | 2013223527 A | 10/2013 |

OTHER PUBLICATIONS

Search Report for PCT/JP2015/074238, dated Oct. 6, 2015.
German Office Action, Application No. 11 2015 006 679.9, dated Feb. 15, 2019.

* cited by examiner

CONDUCTIVE PATH WITH NOISE FILTER

CROSS-REFERENCE TO RELATED APPLICATIONS

This application is the U.S. national stage of PCT/JP2015/074238 filed Aug. 27, 2015, which claims priority of Japanese Patent Application No. JP 2015-137733 filed Sep. 7, 2015.

TECHNICAL FIELD

The present invention relates to a conductive path with noise filter.

BACKGROUND

JP 2010-126043A discloses a technique in which a wire harness including three-phase AC wires is arranged between a motor and an inverter device in an electric vehicle, the wire harness is surrounded by a braided wire in order to take a measure against noise produced by the wire harness, and the two ends of the braided wire are connected to a shielding case of the motor and a shielding case of the inverter device. Using the braided wire to shield the wire harness in this manner makes it possible to prevent noise produced by the motor, the inverter device, and the wire harness from affecting surrounding devices or circuits.

However, using this method of surrounding a wire harness with a braided wire, it is difficult to effectively reduce surge noise in a specific frequency band produced by the inverter device.

The present invention was accomplished based on the above-mentioned circumstances, and it is an object thereof to provide a conductive path with noise filter that enables an effective reduction in surge noise in a specific frequency band.

SUMMARY

A conductive path with noise filter of the present invention includes: a conductive path main body; an insulating layer surrounding the conductive path main body; a conductive layer that is provided to correspond to the conductive path main body with the insulating layer being sandwiched between the conductive layer and the conductive path main body and that forms a capacitor in combination with the conductive path main body; and an inductor connected to the conductive layer, wherein two of the conductive path main bodies are provided in parallel, two of the conductive layers that respectively correspond to the two conductive path main bodies are connected via the inductors, the conductive layers are connected only to the inductor, and each of the inductors is connected only to one of the conductive layers and the other inductor.

Advantageous Effects of Invention

Setting the electrostatic capacitance of a capacitor by changing the length of the conductive layer, the corresponding areas of the conductive layer and the conductive path main body, the distance between the conductive layer and the conductive path main body, the material for the insulating layer, and the like, and setting the inductance of the inductor by changing the winding number, the length, or the like of a coil make it possible to effectively reduce surge noise in a specific frequency band due to LC resonance. Moreover, a surge current in one of the conductive path main bodies can be attenuated by the capacitor and the inductor and discharged to the other conductive layer, thus making it possible to reduce common mode noise, which is of concern when the conductive layer and the inductor are connected to a housing ground such as a motor case.

DETAILED DESCRIPTION OF PREFERRED EMBODIMENTS (a) The conductive path with noise filter of the present invention may also include a first conductive path main body included in a three-phase AC circuit, a second conductive path main body included in the three-phase AC circuit together with the first conductive path main body, a third conductive path main body included in the three-phase AC circuit together with the first conductive path main body and the second conductive path main body, a first conductive layer corresponding to the first conductive path main body, a second conductive layer corresponding to the second conductive path main body, and a third conductive layer corresponding to the third conductive path main body, and have a configuration in which the first conductive layer, the second conductive layer and the third conductive layer are mutually connected via the inductors, the first conductive layer, the second conductive layer and the third conductive layer are connected only to the inductors, the inductor connected to the first conductive layer is connected only to the first conductive layer, the second conductive layer, the inductor connected to the second conductive path, and the inductor connected to the third conductive path, the inductor connected to the second conductive layer is connected only to the second conductive layer, the third conductive layer, the inductor connected to the third conductive path, and the inductor connected to the first conductive path, and the inductor connected to the third conductive layer is connected only to the third conductive layer, the first conductive layer, the inductor connected to the first conductive path, and the inductor connected to the second conductive path.

(b) The conductive path with noise filter of the present invention may also include a first conductive path main body included in a three-phase AC circuit, a second conductive path main body included in the three-phase AC circuit together with the first conductive path main body, a third conductive path main body included in the three-phase AC circuit together with the first conductive path main body and the second conductive path main body, a first conductive layer corresponding to the first conductive path main body, a second conductive layer corresponding to the second conductive path main body, and a third conductive layer corresponding to the third conductive path main body, and have a configuration in which the first conductive layer, the second conductive layer and the third conductive layer are mutually connected via the inductors, the first conductive layer, the second conductive layer and the third conductive layer are connected only to the inductors, the inductor connected to the first conductive layer is connected only to the first conductive layer, the inductor connected to the second conductive layer, and the inductor connected to the third conductive path, the inductor connected to the second conductive layer is connected only to the second conductive layer, the inductor connected to the first conductive layer, and the inductor connected to the third conductive path, and the inductor connected to the third conductive layer is connected only to the third conductive layer, the inductor connected to the first conductive layer, and the inductor connected to the second conductive path.

With the configurations according to (a) and (b), a surge current in each of the conductive path main bodies can be attenuated by the capacitor and the inductor and discharged to the other conductive layers, thus making it possible to reduce common mode noise, which is of concern when the conductive layer and the inductor are connected to a housing ground such as a motor case.

(c) The conductive path with noise filter of the present invention may also have a configuration in which a tubular shielding layer surrounds a plurality of the conductive path main bodies and a plurality of the conductive layers all together.

With this configuration, the shielding layer surrounds the conductive path main bodies, thus making it possible to also prevent surge noise from affecting surrounding devices or circuits.

(d) The conductive path with noise filter of the present invention according to (c) may also have a configuration in which the inductors are arranged inside a shielded space surrounded by the shielding layer.

With this configuration, the size can be reduced compared with a case where the inductors are provided on the outside of the shielding layer.

Reference Example 1

Figure 1:
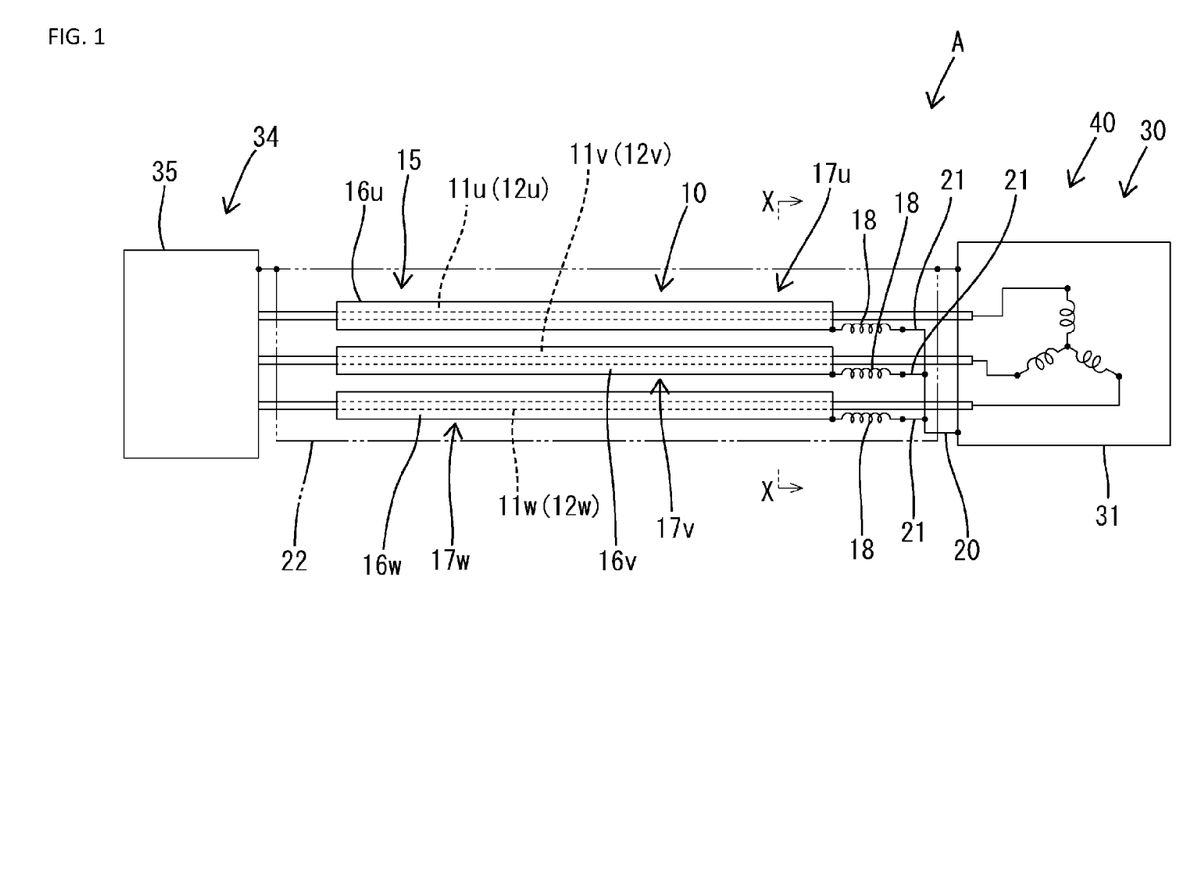
FIG. 1 is a configuration diagram of a conductive path with noise filter of Reference Example 1.
Figure 2:
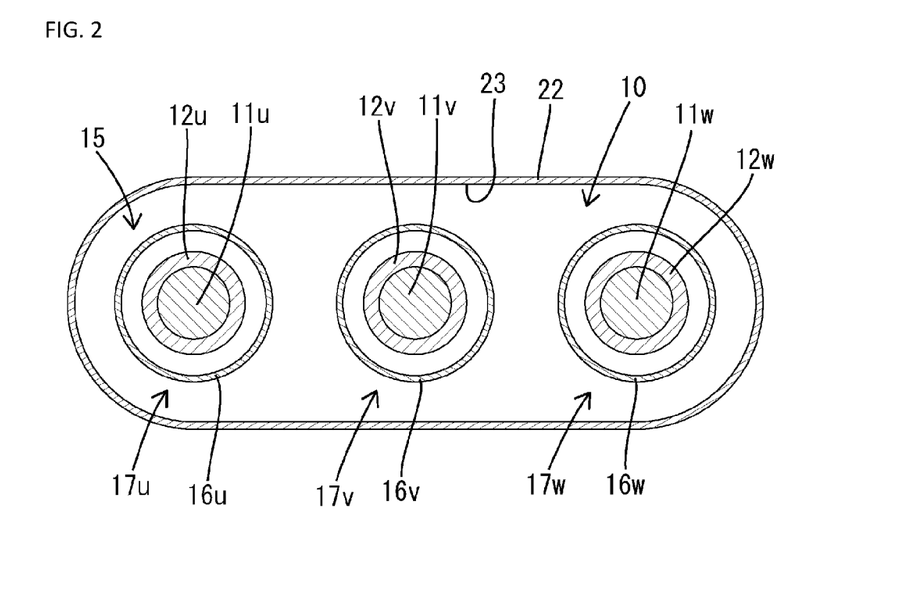
FIG. 2 is a cross-sectional view taken along line X-X in FIG. 1.

Hereinafter, Reference Example 1 of the present invention will be described with reference to FIGS. 1 and 2. A conductive path A with noise filter of Reference Example 1 is arranged between a motor 30 and an inverter device 34 mounted in an electric vehicle (not shown) such as an electric car or a hybrid car. In this electric vehicle, a housing ground 40 is constituted by a motor case 31 that is a housing of the motor 30, an inverter case 35 that is a housing of the inverter device 34, and a shielding layer 22 that connects the cases 31 and 35. The conductive path A with noise filter includes a U-phase wire 11$u$ ("first conductive path main body" in the claims), a V-phase wire 11$v$ ("second conductive path main body" in the claims), and a W-phase wire 11$w$ ("third conductive path main body" in the claims) that constitute a three-phase AC circuit 10, and a surge reducing filter 15 and the shielding layer 22.

The U-phase wire 11$u$, the V-phase wire 11$v$, and the W-phase wire 11$w$ are each constituted by a stranded wire or a single-core wire made of metal (e.g., copper, a copper alloy, aluminum, or an aluminum alloy). The outer circumference of the U-phase wire 11$u$ is surrounded by a U-phase insulating coating 12$u$ ("insulating layer" in the claims) made of a synthetic resin. The outer circumference of the V-phase wire 11$v$ is surrounded by a V-phase insulating coating 12$v$ ("insulating layer" in the claims) made of a synthetic resin. The outer circumference of the W-phase wire 11$w$ is surrounded by a W-phase insulating coating 12$w$ ("insulating layer" in the claims) made of a synthetic resin.

Specifically, the U-phase wire 11$u$ and the U-phase insulating coating 12$u$ make up one coated electric wire. The V-phase wire 11$v$ and the V-phase insulating coating 12$v$ make up one coated electric wire. The W-phase wire 11$w$ and the W-phase insulating coating 12$w$ make up one coated electric wire.

The U-phase wire 11$u$, the V-phase wire 11$v$, and the W-phase wire 11$w$ are arranged in parallel. One end of each of the U-phase wire 11$u$, the V-phase wire 11$v$, and the W-phase wire 11$w$ is connected to an inverter circuit (not shown) of the inverter device 34. The inverter circuit is accommodated inside the conductive inverter case 35, which has a shielding function. The other end of each of the U-phase wire 11$u$, the V-phase wire 11$v$, and the W-phase wire 11$w$ is connected to the windings of the motor 30. The windings are accommodated inside the conductive motor case 31, which has a shielding function.

The surge reducing filter 15 includes a tubular U-phase conductive layer 16$u$ ("first conductive layer" in the claims), a tubular V-phase conductive layer 16$v$, and a tubular W-phase conductive layer 16$w$. Each of the U-phase conductive layer 16$u$, the V-phase conductive layer 16$v$, and the W-phase conductive layer 16$w$ is made of metal (e.g., copper, a copper alloy, aluminum, or an aluminum alloy) and is not directly connected to the housing ground 40. The outer circumference of each of the U-phase conductive layer 16$u$, the V-phase conductive layer 16$v$, and the W-phase conductive layer 16$w$ is coated with an insulating coating, an insulating film, or the like.

The U-phase wire 11$u$ and the U-phase insulating coating 12$u$ are surrounded by the U-phase conductive layer 16$u$ in a state of being in proximity to each other. In other words, their positional relationship is such that the U-phase conductive layer 16$u$ and the U-phase wire 11$u$ are in proximity to each other and face each other with the U-phase insulating coating 12$u$ being sandwiched therebetween. Accordingly, the U-phase wire 11$u$, the U-phase insulating coating 12$u$, and the U-phase conductive layer 16$u$ constitute a U-phase capacitor 17$u$ ("capacitor" in the claims), and the U-phase wire 11$u$ and the U-phase conductive layer 16$u$ serve as electrodes.

Also, the V-phase wire 11$v$ and the V-phase insulating coating 12$v$ are surrounded by the V-phase conductive layer 16$v$ in a state of being in proximity to each other. In other words, their positional relationship is such that the V-phase conductive layer 16$v$ and the V-phase wire 11$v$ are in proximity to each other and face each other with the V-phase insulating coating 12$v$ being sandwiched therebetween. Accordingly, the V-phase wire 11$v$, the V-phase insulating coating 12$v$, and the V-phase conductive layer 16$v$ constitute a V-phase capacitor 17$v$ ("capacitor" in the claims), and the V-phase wire 11$v$ and the V-phase conductive layer 16$v$ serve as electrodes.

Similarly, the W-phase wire 11$w$ and the W-phase insulating coating 12$w$ are surrounded by the W-phase conductive layer 16$w$ in a state of being in proximity to each other. In other words, their positional relationship is such that the W-phase conductive layer 16$w$ and the W-phase wire 11$w$ are in proximity to each other and face each other with the W-phase insulating coating 12$w$ being sandwiched therebetween. Accordingly, the W-phase wire 11$w$, the W-phase insulating coating 12$w$, and the W-phase conductive layer 16$w$ constitute a W-phase capacitor 17$w$ ("capacitor" in the claims), and the W-phase wire 11$w$ and the W-phase conductive layer 16$w$ serve as electrodes.

The surge reducing filter 15 includes three inductors 18 that are each obtained by bending a metal single-core wire into a coil shape. The U-phase conductive layer 16u, the V-phase conductive layer 16v, and the W-phase conductive layer 16w are connected to the motor case 31 via a housing connection wire 20 (inductors 18). The housing connection wire 20 includes three parallel branch wires 21 that are respectively connected to the U-phase conductive layer 16u, the V-phase conductive layer 16v, and the W-phase conductive layer 16w. Each of intermediate portions of the parallel branch wires 21 is provided with the inductor 18. The three inductors 18 are star-connected by the parallel branch wires 21, and connected to the motor case 31 (housing ground 40) via the housing connection wire 20.

The shielding layer 22 is a tubular metal member constituted by a braided wire or the like, for example. One end of the shielding layer 22 is located near the motor 30, and connected to the motor case 31 such that electrical conduction is established. The other end of the shielding layer 22 is located near the inverter device 34, and connected to the inverter case 35 such that electrical conduction is established. A space surrounded by the shielding layer 22 serves as a shielded space 23. The shielding layer 22 surrounds the U-phase wire 11u, the V-phase wire 11v, the W-phase wire 11w, the U-phase conductive layer 16u, the V-phase conductive layer 16v, and the W-phase conductive layer 16w all together. In other words, the U-phase wire 11u, the V-phase wire 11v, the W-phase wire 11w, the U-phase conductive layer 16u, the V-phase conductive layer 16v, and the W-phase conductive layer 16w (that is, three capacitors 17u, 17v, and 17w) are accommodated inside the shielded space 23. In addition, the three inductors 18 are accommodated inside the shielded space 23.

Next, the functions of Reference Example 1 will be described. After the frequency of a surge voltage produced by the inverter device 34 has been determined, the lengths of the conductive layers 16u, 16v and 16w, the corresponding areas of the conductive layers 16u, 16v and 16w and the conductive path main bodies (the U-phase wire 11u, the V-phase wire 11v, the W-phase wire 11w), the distances between the conductive layers 16u, 16v and 16w and the conductive path main bodies (the U-phase wire 11u, the V-phase wire 11v, the W-phase wire 11w), the materials for the U-phase insulating coating 12u, the V-phase insulating coating 12v and the W-phase insulating coating 12w, and the like are selected as appropriate, setting the electrostatic capacitances of the capacitors 17u, 17v and 17w suitable for reducing surge noise at the determined frequency.

Regarding the inductors 18, the materials for and cross-sectional areas of the wires (single-core wires) used therein, the winding numbers of the coils, and the like are selected as appropriate, setting the inductances of the inductors 18 suitable for reducing surge noise at the determined frequency. When the capacitors 17u, 17v and 17w, and the inductors 18 are set in this manner, a surge current at a specific frequency flows into the motor case 31 via the inductors 18 and the housing connection wire 20, and returns to the inverter device 34 via the shielding layer 22, resulting in a reduction of the surge noise. The shielding layer 22 surrounds the conductive path main bodies (the U-phase wire 11u, the V-phase wire 11v, the W-phase wire 11w) all together. The motor case 31 and the inverter case 35 are connected to each other by the shielding layer 22. It should be noted that a conductive means for connecting the motor case 31 and the inverter case 35 is not limited to the shielding layer 22, and a stranded wire, a single-core wire, a vehicle body, or the like may also be used.

The conductive path A with noise filter of Reference Example 1 includes the conductive path main bodies (the U-phase wire 11u, the V-phase wire 11v, and the W-phase wire 11w), the insulating layers (the U-phase insulating coating 12u, the V-phase insulating coating 12v, and the W-phase insulating coating 12w) that respectively surround these conductive path main bodies, the conductive layers (the U-phase conductive layer 16u, the V-phase conductive layer 16v, and the W-phase conductive layer 16w) that are respectively provided to correspond to the conductive path main bodies (the U-phase wire 11u, the V-phase wire 11v, and the W-phase wire 11w) with the insulating layers 12u, 12v and 12w being sandwiched between the conductive layers and the conductive path main bodies and that respectively form capacitors (the U-phase capacitor 17u, the V-phase capacitor 17v, and the W-phase capacitor 17w) in combination with the conductive path main bodies 11u, 11v and 11w, and the inductors 18 connected to these conductive layers 16u, 16v and 16w.

Setting the electrostatic capacitances of the capacitors 17u, 17v and 17w by selecting, as appropriate, the lengths of the conductive layers 16u, 16v and 16w, the corresponding areas of the conductive layers 16u, 16v and 16w and the conductive path main bodies (the U-phase wire 11u, the V-phase wire 11v, the W-phase wire 11w), the distance between the conductive layers 16u, 16v and 16w and the conductive path main bodies (the U-phase wire 11u, the V-phase wire 11v, the W-phase wire 11w), the materials for the U-phase insulating coating 12u, the V-phase insulating coating 12v, and the W-phase insulating coating 12w, and the like, and setting the inductances of the inductors 18 by changing the winding number, the length, or the like of a coil make it possible to effectively reduce surge noise in a specific frequency band due to LC resonance.

The tubular shielding layer 22 surrounds the three conductive path main bodies 11u, 11v and 11w and the three conductive layers 16u, 16v and 16w all together, and the inductors 18 are accommodated inside the shielded space 23, which is a dead space inside the shielding layer 22, thus making it possible to reduce the size compared with a case where the inductors 18 are provided on the outside of the shielding layer 22.

Embodiment 1

Figure 3:
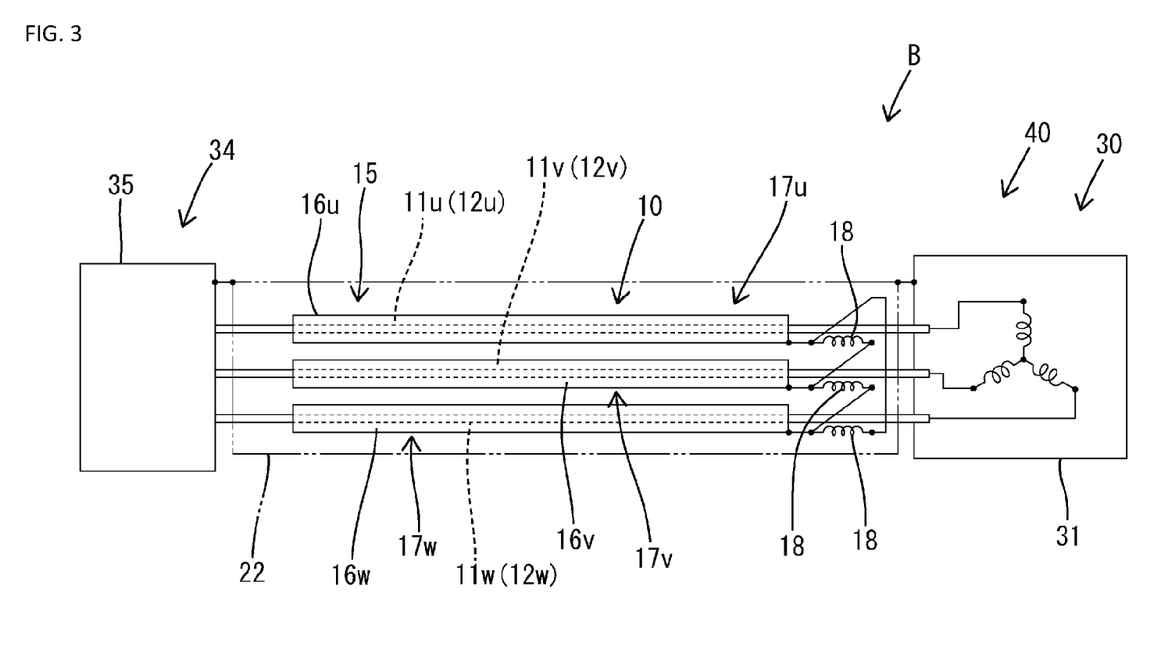
FIG. 3 is a configuration diagram of a conductive path with noise filter of Embodiment 1.

Next, Embodiment 1 in which the present invention is embodied will be described with reference to FIG. 3. A conductive path B with noise filter of Embodiment 1 has a configuration in which the three inductors 18 are connected in a way different from that in Reference Example 1 above. Other structural aspects are identical to those of Reference Example 1 above. Therefore, identical structural aspects are denoted by identical reference numerals, and descriptions of these structures, functions, and effects are omitted.

In Reference Example 1 above, the housing connection wire 20 for grounding the U-phase conductive layer 16u, the V-phase conductive layer 16v, and the W-phase conductive layer 16w is provided, and each of the three parallel branch wires 21 of this housing connection wire 20 is provided with the inductor 18. In contrast, in Embodiment 1, the housing connection wire 20 is not provided, the U-phase conductive layer 16u and the V-phase conductive layer 16v are connected via the inductor 18, the V-phase conductive layer 16v and the W-phase conductive layer 16w are connected via the inductor 18, and the W-phase conductive layer 16w and the U-phase conductive layer 16u are connected via the inductor 18. That is, the three inductors 18 are delta-connected. At the end portions on the motor 30 side of the U-phase wire 11u, the V-phase wire 11v and the W-phase wire 11w, neither the three conductive layers 16u, 16v and 16w nor the three inductors 18 are connected to the housing ground 40.

In the conductive path B with noise filter of Embodiment 1, at least two of the conductive path main bodies 11u, 11v and 11w are provided in parallel, and at least two of the conductive layers 16u, 16v and 16w that respectively surround the conductive path main bodies 11u, 11v, and 11w are connected via the inductors 18. The conductive layers 16u, 16v and 16w are connected only to the inductors 18, and the inductors 18 are connected only to the conductive layers 16u, 16v and 16w. With this configuration, a surge current in each of the wires 11u, 11v and 11w can be attenuated by the capacitors 17u, 17v and 17w and the inductors 18, and discharged to the other conductive layers 16u, 16v and 16w, thus making it possible to reduce common mode noise, which is of concern when the conductive layers 16u, 16v and 16w are connected to the motor case 31 or the like.

The conductive path B with noise filter includes the U-phase wire 11u included in a three-phase AC circuit 10, the V-phase wire 11v included in the three-phase AC circuit 10 together with the U-phase wire 11u, the W-phase wire 11w included in the three-phase AC circuit 10 together with the U-phase wire 11u and the V-phase wire 11v, the U-phase conductive layer 16u surrounding the U-phase wire 11u, the V-phase conductive layer 16v surrounding the V-phase wire 11v, and the U-phase conductive layer 16u surrounding the W-phase wire 11w, and has a configuration in which the U-phase conductive layer 16u, the V-phase conductive layer 16v, and the W-phase conductive layer 16w are mutually connected via the inductors 18.

The three conductive layers 16u, 16v and 16w are directly connected only to the inductors 18. Each of the inductors 18 is directly connected only to one of the U-phase conductive layer 16u, the V-phase conductive layer 16v, and the W-phase conductive layer 16w, and one of the remaining inductors 18. With this configuration, a surge current in each of the wires 11u, 11v and 11w can be attenuated by the capacitors 17u, 17v and 17w and the inductors 18, and discharged to the other conductive layers 16u, 16v and 16w, thus making it possible to reduce common mode noise, which is of concern when the conductive layers 16u, 16v and 16w and the inductors 18 are connected to the motor case 31 or the like.

Reference Example 2

Figure 4:
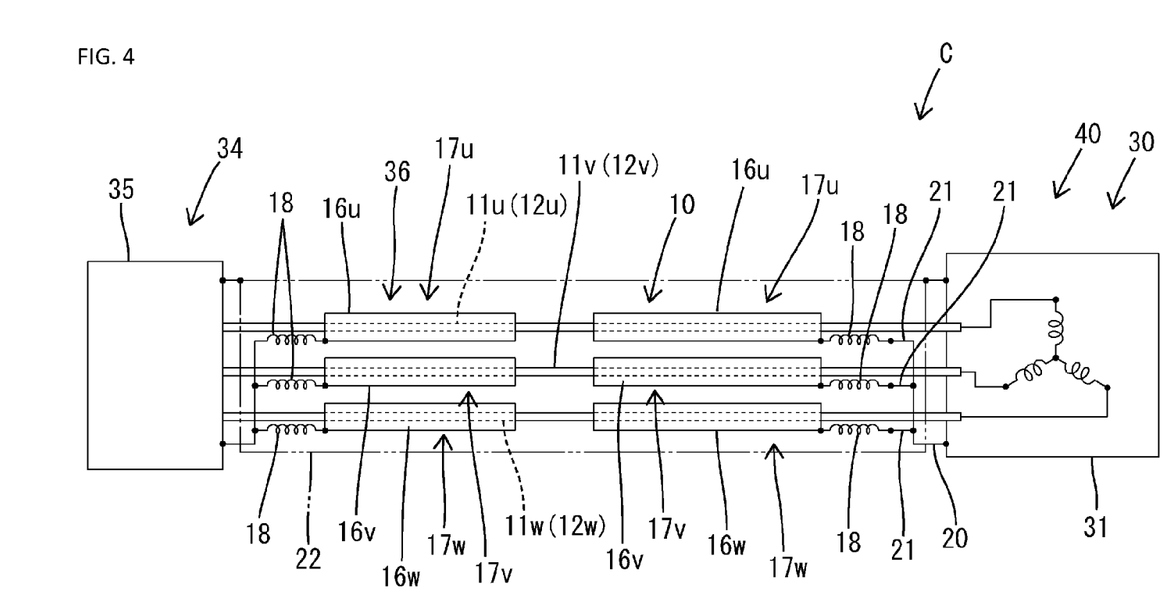
FIG. 4 is a configuration diagram of a conductive path with noise filter of Reference Example 3.

Next, Reference Example 2 of the present invention is embodied will be described with reference to FIG. 4. A conductive path C with noise filter of Reference Example 2 has a configuration that differs from that of Reference Example 1 above in that a surge reducing filter 36 is used. Other structural aspects are identical to those of Reference Example 1 above. Therefore, identical structural aspects are denoted by identical reference numerals, and descriptions of these structures, functions, and effects are omitted.

The surge reducing filter 36 of Reference Example 2 includes two separate U-phase conductive layers 16u, one of which is located on the motor 30 side and the other of which is located on the inverter device 34 side, two separate V-phase conductive layers 16v, one of which is located on the motor 30 side and the other of which is located on the inverter device 34 side, and two separate W-phase conductive layers 16w, one of which is located on the motor 30 side and the other of which is located on the inverter device 34 side. The U-phase conductive layer 16u, the V-phase conductive layer 16v and the W-phase conductive layer 16w located on the motor 30 side are not directly connected to the U-phase conductive layer 16u, the V-phase conductive layer 16v and the W-phase conductive layer 16w located on the inverter device 34 side, respectively. The U-phase wire 11u, the V-phase wire 11v and the W-phase wire 11w respectively include two separate U-phase capacitors 17u, one of which is located on the motor 30 side and the other of which is located on the inverter device 34 side, two separate V-phase capacitors 17v, one of which is located on the motor 30 side and the other of which is located on the inverter device 34 side, and two separate W-phase capacitors 17w, one of which is located on the motor 30 side and the other of which is located on the inverter device 34 side.

Furthermore, the surge reducing filter 36 of Reference Example 2 includes three inductors 18 that are respectively connected to the U-phase conductive layer 16u, the V-phase conductive layer 16v and the W-phase conductive layer 16w located on the motor 30 side, and three inductors 18 that are respectively connected to the U-phase conductive layer 16u, the V-phase conductive layer 16v and the W-phase conductive layer 16w located on the inverter device 34 side. The three inductors 18 located on the motor 30 side are star-connected and are connected to the housing ground 40 (motor case 31), and the three inductors 18 located on the inverter device 34 side are also star-connected and are connected to the housing ground 40 (inverter case 35).

Embodiment 2

Figure 5:
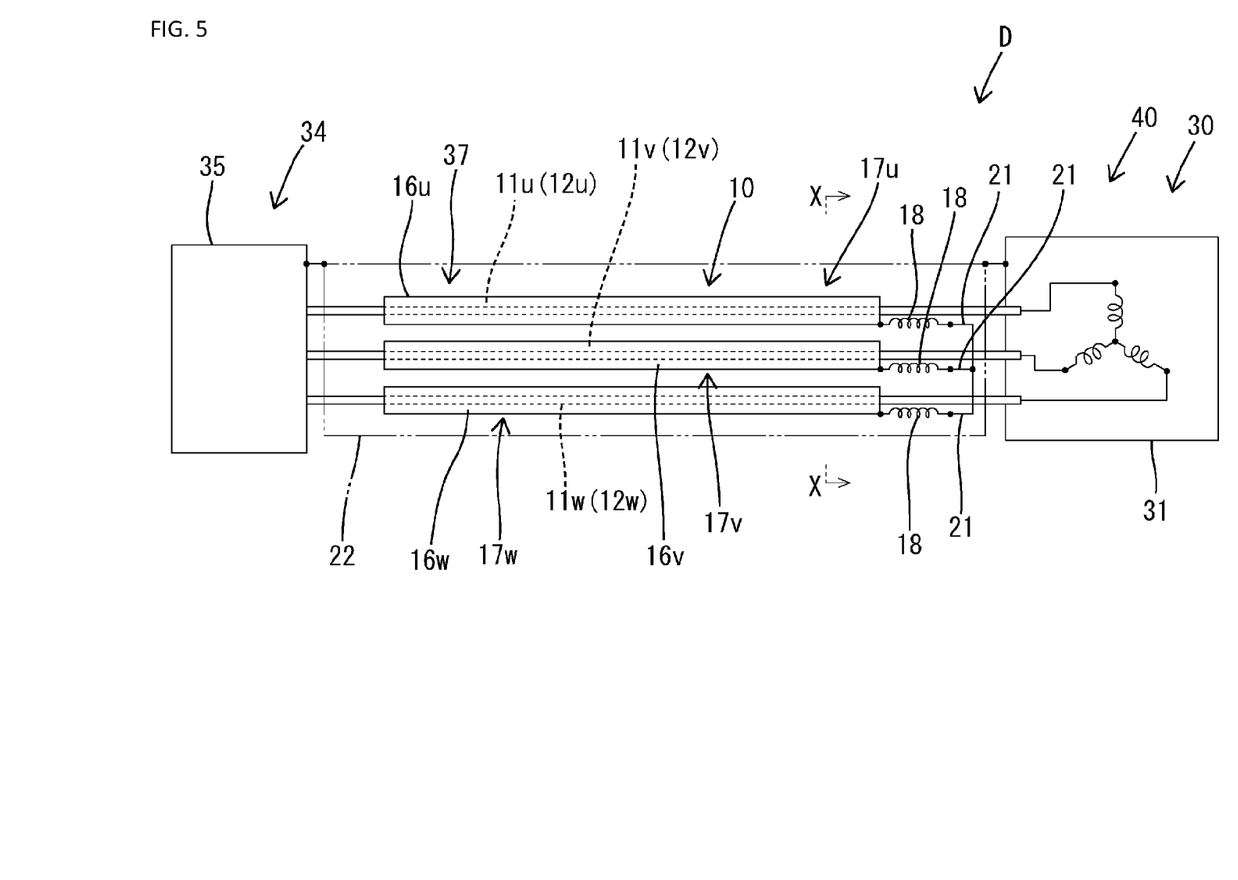
FIG. 5 is a configuration diagram of a conductive path with noise filter of Embodiment 2.

Next, Embodiment 2 in which the present invention is embodied will be described with reference to FIG. 5. A conductive path D with noise filter of Embodiment 2 has a configuration that differs from that of Reference Example 1 above in that a surge reducing filter 37 is used. Other structural aspects are identical to those of Reference Example 1 above. Therefore, identical structural aspects are denoted by identical reference numerals, and descriptions of these structures, functions, and effects are omitted.

The surge reducing filter 15 of Reference Example 1 above includes the three parallel branch wires 21 that are respectively connected to the U-phase conductive layer 16u, the V-phase conductive layer 16v, and the W-phase conductive layer 16w, and the three parallel branch wires 21 are each provided with the inductors 18 and are star-connected. The conductive layers 16u, 16v and 16w and the three inductors 18 are connected to the housing ground (motor case 31) via the housing connection wire 20. In contrast, in Embodiment 2, the conductive layers 16u, 16v and 16w and the three inductors 18 are not connected to the motor case 31.

Other Embodiments

The present invention is not limited to the embodiments that have been described above with reference to the drawings, and embodiments such as those described below are also included in the technical scope of the present invention, for example.

Although, in Embodiments 1 and 2 above, the inductors are accommodated inside the shielding layer, the inductors may also be arranged outside the shielding layer.

(2) Although, in Embodiments 1 and 2 above, the shielding layer surrounds the plurality of conductive path main bodies all together, a configuration in which such a shielding layer is not provided may also be applied.

(3) Although, in Embodiments 1 and 2 above, the three conductive path main bodies constituting the three-phase AC circuit are star-connected, the present invention can also be applied to a case where three conductive path main bodies constituting a three-phase AC circuit are delta-connected.

(4) Although, in Embodiments 1 and 2 above, the three conductive path main bodies constitute the three-phase AC circuit, the present invention can also be applied to a case where the conductive path main bodies do not constitute a three-phase AC circuit.

(5) Although, in Embodiments 1 and 2 above, the number of the conductive path main bodies is three, the present invention can also be applied to a case where the number of the conductive path main bodies is one, two, or four or more.

(6) Although, in Embodiments 1 and 2 above, the flexible stranded wires having a circular cross section are used as the conductive path main bodies, busbars that are not deformed easily, flat cables in which a plurality of electric wires are arranged in parallel, or the like may also be used.

(7) Although, in Embodiments 1 and 2 above, each of the insulating layers are integrated with the outer circumference of the conductive path main body and included in the coated wire, each of the insulating layers may also be integrated with the inner circumference of the conductive layer, or arranged between the outer circumference of the conductive path main body and the inner circumference of the conductive layer so as to be capable of being displaced relatively.

(8) Although, in Embodiments 1 and 2 above, the main body of the conductive path with noise filter is arranged between the motor and the inverter device, the present invention can also be applied to a case where the conductive path with noise filter is to be connected to devices other than the motor and the inverter device.

(9) Although, in Embodiments 1 and 2 above, each of the conductive layers corresponds to the conductive path main body and surrounds the entire circumference thereof, each of the conductive layers may be configured to correspond to only a partial region of the conductive path main body in a circumferential direction.

(10) Although, in Embodiments 1 and 2 above, the inductors are arranged on only the motor side and connected only to the motor case, inductors may also be provided on the inverter device side in addition to the inductors on the motor side, and connected to the inverter case.

(11) Although, in Embodiments 1 and 2 above, the conductive layers are made of metal having a tubular shape, sheet-like or tape-like metal foils, braided wires, metal busbars, metal stranded wires, metal single-core wires, core materials with a plated surface, conductive resins, conductive rubbers, or the like may also be used.

(12) Although, in Embodiments 1 and 2 above, the metal single-core wires are used as the inductors, metal stranded wires may also be used as the inductors.

(13) Although, in the Embodiments 1 and 2 above, the inductors have a coil shape, the inductors may be magnetic cores such as ferrite cores.

(14) Although, in Embodiments 1 and 2 above, the conductive layers are directly connected only to the inductors, there is no limitation thereto. Components such as resistances that independently exhibit a noise filtering function, components that exhibit a noise filtering function together with the conductive layers and the inductors, or the like may also be connected to the conductive layers in parallel with the inductors.

The invention claimed is:

1. A conductive path with a noise filter comprising:
a three-phase AC circuit having a plurality of conductive path main bodies, the plurality of conductive path main bodies including a first conductive path main body, a second conductive path main body, and a third conductive path main body;
a first conductive layer of a plurality of conductive layers corresponding to the first conductive path main body;
a second conductive layer of the plurality of conductive layers corresponding to the second conductive path main body; and
a third conductive layer of the plurality of conductive layers corresponding to the third conductive path main body,
an insulating layer concentric to each of the conductive path main bodies;
the first, second and third conductive layers being concentric to a respective insulating layer so as to place the insulating layer between the respective first, second and third conductive layers and the corresponding conductive path main body, the first, second and third conductive layers each forming a capacitor in combination with the corresponding first, second and third conductive path main bodies; and
each of the first, second and third conductive path main bodies having an inductor, wherein the first conductive layer, the second conductive layer and the third conductive layer are mutually connected via the inductors;
wherein the first conductive layer, the second conductive layer and the third conductive layer are each directly connected only to one of the inductors,
the inductor connected to the first conductive layer is directly connected only to the first conductive layer, the inductor connected to the second conductive layer, and the inductor connected to the third conductive layer,
the inductor connected to the second conductive layer is directly connected only to the second conductive layer, the inductor connected to the first conductive layer, and the inductor connected to the third conductive layer, and
the inductor connected to the third conductive layer is directly connected only to the third conductive layer, the inductor connected to the first conductive layer, and the inductor connected to the second conductive layer.

2. The conductive path with the noise filter according to claim 1, comprising:
a connection wire having one end grounded to a housing and another end having a pair of branch wires in parallel with each other,
wherein the connection wire further includes a third parallel branch wire that is in parallel with the pair of branch wires,
wherein the first conductive layer, and the second conductive layer are connected to a corresponding pair of second inductors, and the pair of second inductors are connected to a corresponding pair of branch wires, and the third conductive layer is connected to a third inductor and the third inductor is connected to the third branch wire so that signals from the first conductive layer, the second conductive layer and the third conductive layer are combined prior to being grounded by the housing.

3. The conductive path with the noise filter according to claim 2,
wherein a tubular shielding layer surrounds the plurality of the conductive path main bodies and the plurality of the conductive layers all together, and
the inductors are arranged inside a shielded space surrounded by the shielding layer.

4. The conductive path with the noise filter according to claim 1,
 wherein a tubular shielding layer surrounds the plurality of the conductive path main bodies and the plurality of the conductive layers all together, and
 the inductors are arranged inside a shielded space surrounded by the shielding layer.

* * * * *